(12) United States Patent
Lee et al.

(10) Patent No.: US 10,476,463 B2
(45) Date of Patent: Nov. 12, 2019

(54) BULK ACOUSTIC WAVE RESONATOR

(71) Applicant: Samsung Electro-Mechanics Co., Ltd., Suwon-si (KR)

(72) Inventors: Tae Hun Lee, Suwon-si (KR); Chang Hyun Lim, Suwon-si (KR); Tae Yoon Kim, Suwon-si (KR); Moon Chul Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 155 days.

(21) Appl. No.: 15/815,966

(22) Filed: Nov. 17, 2017

(65) Prior Publication Data
US 2018/0337650 A1 Nov. 22, 2018

(30) Foreign Application Priority Data

May 18, 2017 (KR) .......................... 10-2017-0061416

(51) Int. Cl.
*H03H 3/007* (2006.01)
*H03H 3/04* (2006.01)
(Continued)

(52) U.S. Cl.
CPC ............ *H03H 3/0077* (2013.01); *H03H 3/02* (2013.01); *H03H 3/04* (2013.01); *H03H 7/422* (2013.01);
(Continued)

(58) Field of Classification Search
CPC .......... H03H 3/0077; H03H 3/02; H03H 3/04; H03H 7/422; H03H 9/0095; H03H 9/0542;
(Continued)

(56) References Cited

U.S. PATENT DOCUMENTS 5,075,641 A * 12/1991 Weber ..................... H01L 27/20
204/192.18
5,166,646 A * 11/1992 Avanic ................... H03B 5/326
257/312
(Continued)

FOREIGN PATENT DOCUMENTS

KR      10-0485702 B1    4/2005

OTHER PUBLICATIONS

Ajinonnoto ABF-T31, Taiyo Zaristo-125, Sumitomo LAZ-7751 and Sekisui NX04H (Hurwitz:§0161), data sheets downloaded from respective websites on Jun. 14, 2019. (Year: 2019).*

*Primary Examiner* — Benny T Lee
*Assistant Examiner* — Hafizur Rahman
(74) *Attorney, Agent, or Firm* — NSIP Law

(57) ABSTRACT

A bulk acoustic wave resonator includes a substrate, a lower electrode connection member, a lower electrode, a piezoelectric layer, an upper electrode, an upper electrode connection member, and a dielectric layer in which the lower electrode, the piezoelectric layer, and the upper electrode are embedded. The lower electrode, the piezoelectric layer, and the upper electrode constitute a resonant portion. An extension portion extends away from either the lower electrode or the upper electrode to protrude outwardly from the resonant portion. A capacitor portion is constituted by the extension portion, a portion of the upper electrode connection member disposed above the extension portion, and a portion of the dielectric layer disposed between the extension portion and the portion of the upper electrode connection member disposed above the extension portion.

23 Claims, 11 Drawing Sheets

(51) Int. Cl.
*H03H 7/42* (2006.01)
*H03H 9/00* (2006.01)
*H03H 3/02* (2006.01)
*H03H 9/05* (2006.01)
*H03H 9/17* (2006.01)

(52) U.S. Cl.
CPC ........ *H03H 9/0095* (2013.01); *H03H 9/0542* (2013.01); *H03H 9/173* (2013.01); *H03H 2003/0071* (2013.01); *H03H 2003/021* (2013.01)

(58) Field of Classification Search
CPC ........... H03H 9/173; H03H 2003/0071; H03H 2003/021
USPC ........................................................ 333/186
See application file for complete search history.

(56) References Cited

U.S. PATENT DOCUMENTS

| | | |
|---|---|---|
| 7,490,390 B2 | 2/2009 | Kawakubo et al. |
| 2005/0012571 A1 | 1/2005 | Song et al. |
| 2007/0209176 A1 | 9/2007 | Kawakubo et al. |
| 2016/0197593 A1* | 7/2016 | Hurwitz .................. H03H 3/04 29/25.35 |

* cited by examiner

BULK ACOUSTIC WAVE RESONATOR

CROSS-REFERENCE TO RELATED APPLICATIONS

This application claims the benefit under 35 USC 119(a) of Korean Patent Application No. 10-2017-0061416 filed on May 18, 2017, in the Korean Intellectual Property Office, the entire disclosure of which is incorporated herein by reference for all purposes.

BACKGROUND

1. Field

This application relates to a bulk acoustic wave resonator.

2. Description of Related Art

As demands for bandwidth have increased, telecommunications companies have continuously demanded high performance and stabilization of device characteristics as well as miniaturization in manufacturing bulk acoustic wave resonators and microelectromechanical system (MEMS) devices.

In detail, as the usage of bandwidth and different bands increase, band gaps between bands need to be gradually reduced.

In addition, such a phenomenon causes in-band gaps and gaps between bands to be narrowed due to a lack of frequency resources, leading to a need for interference prevention.

To improve such characteristics, there is a need to suppress insertion loss, significantly reduce inter-band interference, and prevent the occurrence of in-band notches.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator includes a substrate; a lower electrode connection member disposed on the substrate; a lower electrode disposed on the lower electrode connection member; a piezoelectric layer disposed on the lower electrode; an upper electrode disposed on the piezoelectric layer; an upper electrode connection member electrically connecting the upper electrode to the substrate; and a dielectric layer in which the lower electrode, the piezoelectric layer, and the upper electrode are embedded; wherein the lower electrode, the piezoelectric layer, and the upper electrode constitute a resonant portion; the bulk acoustic wave resonator further includes an extension portion extending from either the lower electrode or the upper electrode to protrude outwardly from the resonant portion; and a capacitor portion is constituted by the extension portion, a portion of the upper electrode connection member disposed above the extension portion, and a portion of the dielectric layer disposed between the extension portion and the portion of the upper electrode connection member disposed above the extension portion.

The capacitor portion may be disposed outside of the lower electrode connection member.

The lower electrode connection member, the resonant portion, and the substrate may form a cavity below the resonant portion; and the capacitor portion may be spaced apart from the substrate.

The extension portion may extend from the lower electrode.

The upper electrode connection member may include an anchor portion disposed on the substrate; a plate portion extending from the anchor portion parallel to an upper surface of the substrate; and a connection portion disposed on an upper surface of the upper electrode and connected to the plate portion.

A portion of the plate portion may serve as an upper electrode of the capacitor portion.

An upper end portion of the anchor portion and the connection portion may be embedded in the dielectric layer.

The lower electrode connection member may electrically connect the lower electrode to the substrate and support the resonant portion.

The lower electrode connection member may have an annular shape and support an edge portion of the resonant portion.

In another general aspect a bulk acoustic wave resonator includes a substrate; a lower electrode connection member disposed on the substrate; a lower electrode disposed on the lower electrode connection member; a piezoelectric layer disposed on the lower electrode; an upper electrode disposed on the piezoelectric layer; an upper electrode connection member electrically connecting the upper electrode to the substrate; a dielectric layer in which the lower electrode, the piezoelectric layer, and the upper electrode are embedded; wherein the lower electrode, the piezoelectric layer, and the upper electrode constitute a resonant portion; the bulk acoustic wave resonator may further include a first extension portion extending from either the lower electrode or the upper electrode to protrude outwardly from the resonant portion; a first capacitor portion is constituted by the first extension portion, a portion of the upper electrode connection member disposed above the first extension portion, and a portion of the dielectric layer disposed between the first extension portion and the portion of the upper electrode connection disposed above the first extension portion; the bulk acoustic wave resonator further includes a second extension portion extending from either the lower electrode or the upper electrode to be spaced apart from the first extension portion and protrude outwardly from the resonant portion, and a second capacitor upper electrode disposed on the dielectric layer above the second extension portion; and a second capacitor portion is constituted by the second extension portion, the second capacitor upper electrode disposed above the second extension portion, and a portion of the dielectric layer disposed between the second extension portion and the second capacitor upper electrode.

The first and second capacitor portions may be disposed outside of the lower electrode connection member.

The lower electrode connection member, the resonant portion, and the substrate may form a cavity below the resonant portion; and the first and second capacitor portions may be spaced apart from the substrate.

The first and second extension portions may extend from the lower electrode.

The upper electrode connection member may include an anchor portion disposed on the substrate; a plate portion extending from the anchor portion parallel to an upper surface of the substrate; and a connection portion disposed on an upper surface of the upper electrode and connected to the plate portion.

A portion of the plate portion may serve as an upper electrode of the first capacitor portion; and the second capacitor upper electrode may serve as an upper electrode of the second capacitor portion.

The lower electrode connection member may electrically connect the lower electrode to the substrate and support the resonant portion.

In another general aspect, a bulk acoustic wave resonator includes a substrate; a lower electrode connection member disposed on the substrate; an upper electrode connection member disposed on the substrate; a resonant portion disposed on the lower electrode connection member and including a lower electrode disposed on the lower electrode connection member and electrically connected to the lower electrode connection member, a piezoelectric layer disposed on the lower electrode, and an upper electrode disposed on the piezoelectric layer and electrically connected to the upper electrode connection member; and a dielectric layer covering an upper surface of the resonant portion and filling a space between the extension portion and the upper electrode connection member; wherein either the lower electrode may include an extension portion extending beyond the an edge of the piezoelectric layer and an edge of the upper electrode toward the upper electrode connection member, or the upper electrode may include an extension portion extending beyond an edge of the lower electrode member and an edge of the piezoelectric layer toward the upper electrode connection member; and a capacitor portion is constituted by the extension portion, a portion of the upper electrode connection member disposed above the extension portion, and a portion of the dielectric layer disposed between the extension portion and the portion of the upper electrode connection member disposed above the extension portion.

The extension may be a first extension and the capacitor portion may be a first capacitor portion; either the lower electrode may include a second extension portion extending beyond the an edge of the piezoelectric layer and an edge of the upper electrode in a second direction different from a first direction in which the first extension extends toward the upper electrode connection member, or the upper electrode may include a second extension portion extending beyond an edge of the lower electrode member and an edge of the piezoelectric layer in a second direction different from a first direction in which the first extension extends toward the upper electrode connection member; the bulk acoustic wave resonator may further include a second capacitor upper electrode disposed on the dielectric layer above the second extension portion; and a second capacitor portion may be constituted by the second extension portion, the second capacitor upper electrode, and a portion of the dielectric layer disposed between the second extension portion and the second capacitor upper electrode.

The lower electrode connection member may be hollow and support an edge portion of the resonant portion; and the lower electrode connection member, the resonant portion, and the substrate may form a cavity under the resonant portion.

The upper electrode connection member includes a plate portion disposed on the dielectric layer; an anchor portion disposed on the substrate and connected to the plate portion through the dielectric layer; and a connection portion connected to the plate portion, and connected to the upper electrode through the dielectric layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

Figure 1:
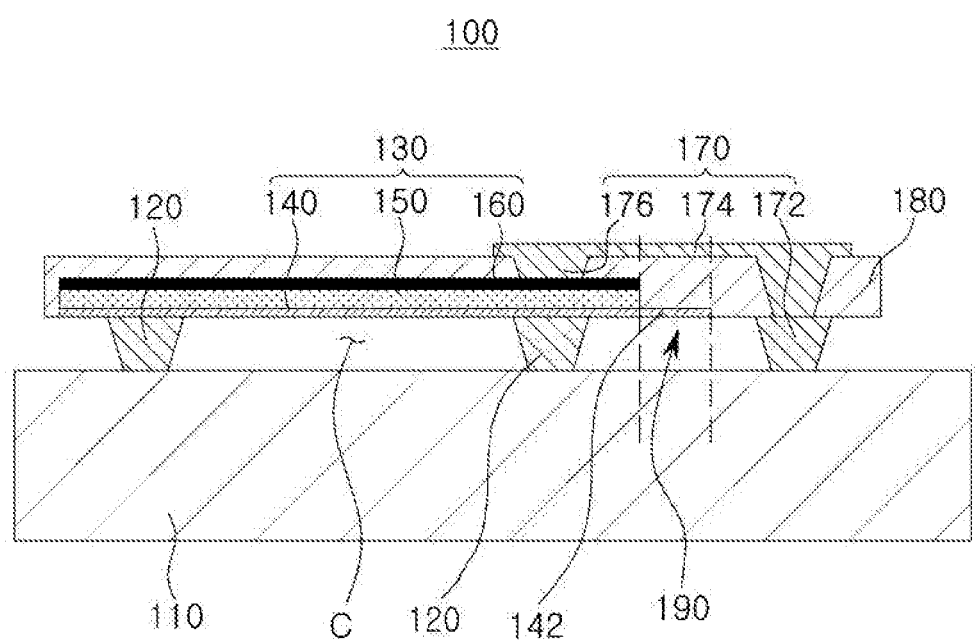
FIG. 1 illustrates a configuration of an example of a bulk acoustic wave resonator.

FIG. 1 illustrates an example of a configuration of a bulk acoustic wave resonator.

Referring to FIG. 1, a first example of a bulk acoustic wave resonator 100 includes a substrate 110, a lower electrode connection member 120, a resonant portion 130, an upper electrode connection member 170, and a dielectric layer 180. As can be seen from FIG. 1, the dielectric layer 180 is spaced apart from the substrate 110.

The substrate 110 may be a silicon substrate. For example, a silicon wafer may be used as the substrate 110. A substrate protective layer (not shown) may be provided on the substrate 110.

The lower electrode connection member 120 is formed on the substrate 110, and forms a cavity C together with the resonant portion 130 and the substrate 110. The lower electrode connection member 120 supports an edge portion of the resonant portion 130. In the example in FIG. 1, the lower electrode connection member 120 has an amorphous annular shape corresponding to a shape of the resonant portion 130. An amorphous annular shape is an annular shape having any desired outside contour. Thus, the lower electrode connection member 120 in the example in FIG. 1 is hollow.

Although FIG. 1 appears to show two lower electrode connection members 120, this is because FIG. 1 shows a cross-section of the lower electrode connection 120, which is hollow as described above, and the two lower electrode connection members 120 apparently shown in FIG. 1 are actually part of only one lower electrode connection member 120.

The lower electrode connection member 120 is formed to support the entirety of an edge portion of the resonant portion 130 to secure a structural rigidity of the bulk acoustic wave resonator 100.

The lower electrode connection member 120 is formed of a conductive material, such as copper (Cu) or tungsten (W), for example.

Since the entirety of an edge portion of the resonant portion 130 is supported by the lower electrode connection member 120, a resistance of an electrode connection part may be reduced and heat dissipation may be improved. Thus, an insertion loss due to electrical loss may be reduced, and an in-band notch failure, which may be caused by a temperature difference due to a difference in power consumption between bulk acoustic wave resonators 100, may be controlled.

The resonant portion 130 is disposed on the lower electrode connection member 120. In the example in FIG. 1, the resonant portion 130 includes a lower electrode 140, a piezoelectric layer 150, and an upper electrode 160.

The lower electrode 140 forms the cavity C together with the lower electrode connection member 120 and the substrate 110, and is formed so that a portion of the lower electrode 140 extends outwardly from the lower electrode connection member 120. In the example in FIG. 1, the piezoelectric layer 150 and the upper electrode 160 are not formed on the portion of the lower electrode 140 that extends outwardly from the lower electrode connection member 120.

In other words, the lower electrode 140 includes an extension portion 142 disposed outside of the lower electrode connection member 120. Although FIG. 1 shows the extension portion 142 as being part of the lower electrode 140, alternatively the extension portion 142 may be part of the upper electrode 160.

The lower electrode 140 is electrically connected to the lower electrode connection member 120.

The lower electrode 140 is formed of a conductive material, such as molybdenum (Mo), ruthenium (Ru), tungsten (W), iridium (Ir), platinum (Pt), or any other suitable conductive material, or an alloy of any two or more of these conductive materials.

The lower electrode 140 may be used as either an input electrode or an output electrode, receiving or transmitting an electrical signal, such as a radio frequency (RF) signal or other signal. For example, when the lower electrode 140 is an input electrode, the upper electrode 160 is an output electrode, and when the lower electrode 140 is an output electrode, the upper electrode 160 is an input electrode.

The piezoelectric layer 150 is formed on the lower electrode 140. As an example, the piezoelectric layer 150 may be formed by depositing aluminum nitride, doped aluminum nitride, zinc oxide, or lead zirconate titanate.

If the piezoelectric layer 150 is formed of aluminum nitride (AlN), it may further include a rare earth metal. As the rare earth metal, for example, any one or any combination of any two or more of scandium (Sc), erbium (Er), yttrium (Y), and lanthanum (La) may be used. In addition, the piezoelectric layer 150 formed of aluminum nitride (AlN) may further include a transition metal. For example, as the transition metal, any one or any combination of any two or more of zirconium (Zr), titanium (Ti), magnesium (Mg), and hafnium (Hf) may be used. Thus, the piezoelectric layer 150 formed of aluminum nitride (AlN) may include one or more rare earth metals, or one or more transition metals, or both one or more rare earth metals and one or more transition metals.

The upper electrode 160 is connected to the upper electrode connection member 170, and is formed on the piezoelectric layer 150. As an example, the upper electrode 160 is formed of a conductive material, such as molybdenum (Mo), ruthenium (Ru), tungsten (W), iridium (Ir), platinum (Pt), or any other suitable conductive material, or an alloy of any two or more of these conductive materials.

The upper electrode connection member 170 is formed on the substrate 110, and has one end connected to the upper electrode 160. In the example in FIG. 1, the upper electrode connection member 170 includes an anchor portion 172 formed on the substrate 110, a plate portion 174 extending from the anchor portion 172, and a connection portion 176 formed on an upper surface of the upper electrode 160 and connected to the plate portion 174.

The connection portion 176 is connected to only a portion of an edge region of the upper electrode 160.

As an example, the upper electrode connection member 170 is formed of a conductive material, such as copper (Cu) or tungsten (W), for example, like the lower electrode connection member 120.

The dielectric layer 180 is formed so that the resonant portion 130, for example, the lower electrode 140, the piezoelectric layer 150 and the upper electrode 160 are embedded in the dielectric later 180. The dielectric layer 180 is also formed in a space between the plate portion 174 of the upper electrode connection member 170 and the extension portion 142 of the lower electrode 140.

In addition, the dielectric layer 180 is formed so that an upper end portion of the anchor portion 172 of the upper electrode connection member 170 and the connection portion 176 are embedded in the dielectric layer 180.

A capacitor portion 190 is constituted by the lower electrode 140, the dielectric layer 180, and the upper electrode connection member 170.

In detail, the capacitor portion 190 is constituted by the extension portion 142 extending from the lower electrode 140 to protrude outwardly from a remaining portion of the resonant portion 130 (i.e., the piezoelectric layer 150 and the upper electrode 160), a portion of the upper electrode connection member 170 disposed above an upper surface of the extension portion 142, and a portion of the dielectric layer 180 disposed between the extension portion 142 and the portion of the upper electrode connection member 170.

In addition, a portion of the plate portion 174 of the upper electrode connection member 170 serves as an upper electrode of the capacitor portion 190.

The capacitor portion 190 is disposed outside of the lower electrode connection member 120, and is spaced apart from the substrate 110 by a predetermined distance.

Since the capacitor portion 190 is provided as described above, a frequency adjustment may be performed for the bulk acoustic wave resonator 100.

Since the entirety of an edge portion of the resonant portion 130 is supported by the lower electrode connection member 120, a resistance of an electrode connection part is reduced, and heat dissipation is improved. Thus, an insertion loss due to an electrical loss may be reduced, and an in-band notch failure, which may be caused by a temperature difference due to a difference in power consumption between bulk acoustic wave resonators 100, may be controlled.

Figure 2:
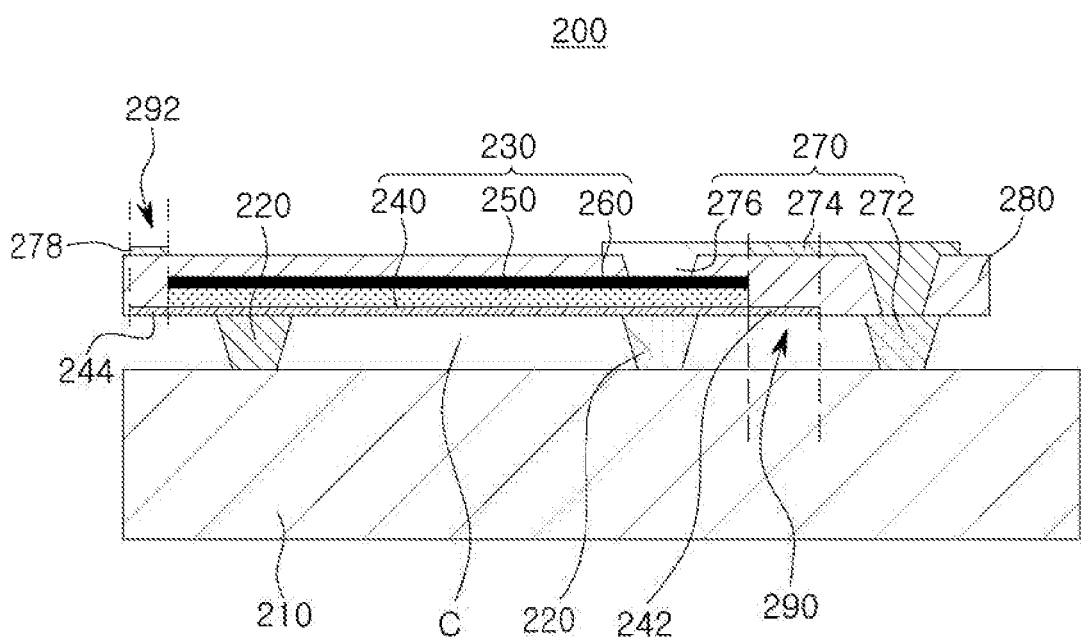
FIG. 2 illustrates a configuration of another example of a bulk acoustic wave resonator.

FIG. 2 illustrates a configuration of another example of a bulk acoustic wave resonator.

Referring to FIG. 2, a second example of a bulk acoustic wave resonator 200 includes a substrate 210, a lower electrode connection member 220, a resonant portion 230, an upper electrode connection member 270, and a dielectric layer 280. As can be seen from FIG. 2, the dielectric layer 280 is spaced apart from the substrate 210.

Since the substrate 210, the lower electrode connection member 220, and the dielectric layer 280 are the same as the substrate 110, the lower electrode connection member 120, and the dielectric layer 180 described above with reference to FIG. 1, a detailed description thereof will be omitted.

Although FIG. 2 appears to show two lower electrode connection members 220, this is because FIG. 2 shows a cross-section of the lower electrode connection 220, which is hollow as described above in connection with FIG. 1, and the two lower electrode connection members 220 apparently shown in FIG. 2 are actually part of only one lower electrode connection member 220.

The resonant portion 230 is disposed on the lower electrode connection member 220. In the example in FIG. 2, the resonant portion 230 includes a lower electrode 240, a piezoelectric layer 250, and an upper electrode 260.

The lower electrode 240 forms a cavity C together with the lower electrode connection member 220 and the substrate 210, and is formed so that portions thereof extend outwardly from the lower electrode connection member 220. In the example in FIG. 2, the piezoelectric layer 250 and the upper electrode 260 are not formed on the portions of the lower electrode 240 that extend outwardly from the lower electrode connection member 220.

In other words, the lower electrode 240 includes a first extension portion 242 and a second extension portion 244 disposed outside of the lower electrode connection member 220. Although FIG. 1 shows the first extension portion 242 and the second extension portion 244 as being part of the lower electrode 240, alternatively the first extension portion 242 and the second extension portion 244 may be part of the upper electrode 260.

The lower electrode 240 is electrically connected to the lower electrode connection member 220.

The lower electrode 240 is formed of a conductive material, such as molybdenum (Mo), ruthenium (Ru), tungsten (W), iridium (Ir), platinum (Pt), or any other suitable conductive material, or an alloy of any two or more of these conductive materials.

The lower electrode 240 may be used as either an input electrode or an output electrode, receiving or transmitting an electrical signal, such as a radio frequency (RF) signal or other signal. For example, when the lower electrode 240 is an input electrode, the upper electrode 260 is an output electrode, and when the lower electrode 240 is an output electrode, the upper electrode 260 is an input electrode.

The piezoelectric layer 250 is formed on the lower electrode 240. As an example, the piezoelectric layer 250 may be formed by depositing aluminum nitride, doped aluminum nitride, zinc oxide, or lead zirconate titanate.

if the piezoelectric layer 250 is formed of aluminum nitride (AlN), it may further include a rare earth metal. As the rare earth metal, for example, any one or any combination of any two or more of scandium (Sc), erbium (Er), yttrium (Y), and lanthanum (La) may be used. In addition, the piezoelectric layer 250 formed of aluminum nitride (AlN) may further include a transition metal. For example, as the transition metal, any one or any combination of any two or more of zirconium (Zr), titanium (Ti), magnesium (Mg), and hafnium (Hf) may be used. Thus, the piezoelectric layer 250 formed of aluminum nitride (AlN) may include one or more rare earth metals, or one or more transition metals, or both one or more rare earth metals and one or more transition metals.

The upper electrode 260 is connected to the upper electrode connection member 270, and is formed on the piezoelectric layer 250. As an example, the upper electrode 260 may be formed of a conductive material, such as molybdenum (Mo), ruthenium (Ru), tungsten (W), iridium (Ir), platinum (Pt), or any other suitable conductive material, or an alloy of any two or more of these conductive materials.

The upper electrode connection member 270 is formed on the substrate 210, and has one end connected to the upper electrode 260. In the example in FIG. 2, the upper electrode connection member 270 includes an anchor portion 272 formed on the substrate 210, a plate portion 274 extending from the anchor portion 272, a connection portion 276 formed on an upper surface of the upper electrode 260 and connected to the plate portion 274.

The connection portion 276 is connected to only a portion of an edge region of the upper electrode 260.

A second capacitor upper electrode 278 is formed on the dielectric layer 280 above the second extension portion 240. The second capacitor upper electrode 278 may be formed by the same process by which the plate portion 274 of the upper electrode connection member 270 is formed.

As an example, the upper electrode connection member 270 and the second capacitor upper electrode 278 are formed of a conductive material such as copper (Cu) or tungsten (W), for example, like the lower electrode connection member 220.

Capacitor portions 290 and 292 are constituted by the lower electrode 240, the dielectric layer 280, the upper electrode connection member 270, and the second capacitor upper electrode 278.

In detail, the first capacitor portion 290 is constituted by the first extension portion 242 extending from the lower electrode 240 to protrude outwardly from a remaining portion of the resonant portion 230 (i.e., the piezoelectric layer 250 and the upper electrode 260), a portion of the upper electrode connection member 270 disposed above the first extension portion 242, and a portion of the dielectric layer 280 disposed between the first extension portion 242 and the portion of the upper electrode connection member 270.

In addition, the second capacitor portion 292 is constituted by the second extension portion 244 extending from the lower electrode 240 to protrude outwardly from a remaining portion of the resonant portion 230 (i.e., the piezoelectric layer 250 and the upper electrode 260), the second capacitor upper electrode 278 disposed above the second extension portion 244, and a portion of the dielectric layer 280 disposed between the second extension portion 244 and the second capacitor upper electrode 278.

In addition, a portion of the plate portion 274 of the upper electrode connection member 270 serves as an upper electrode of the first capacitor portion 290, and the second capacitor upper electrode 278 serves as an upper electrode of the second capacitor portion 292.

The capacitor portions 290 and 292 are disposed outside of the lower electrode connection member 220, and are spaced apart from the substrate 210 by a predetermined distance.

Since the first and second capacitor portions 290 and 292 are provided as described above, a frequency adjustment may be performed for the bulk acoustic wave resonator 200.

Hereinafter, an example of a method of manufacturing a bulk acoustic wave resonator will be described.

FIGS. 3 to 11 are process drawings illustrating an example of a method of manufacturing a bulk acoustic wave resonator.

Figure 3:
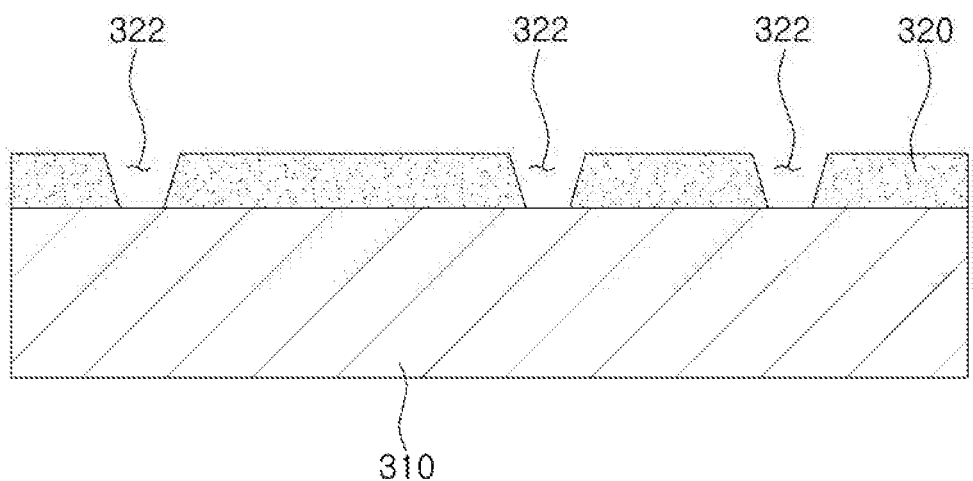
FIGS. 3 to 11 are process drawings illustrating an example of a method of manufacturing a bulk acoustic wave resonator.

First, as illustrated in FIG. 3, a sacrificial layer 320 is formed on a substrate 310. The sacrificial layer 320 includes a plurality of groove portions 322 for the formation of lower electrode connection member 330 and a lower end portion of an upper electrode connection member 340 to be described later.

The sacrificial layer 320 is formed of a material including silicon dioxide ($SiO_2$) or polysilicon, for example. In addition, the sacrificial layer 320 may be formed, for example, by a spin-on-glass process. For example, the sacrificial layer 320 may be formed by spin-coating silicon dissolved in an organic solvent onto the substrate, which is then subjected to a heat treatment to form a silicon dioxide ($SiO_2$) insulating film.

Figure 4:
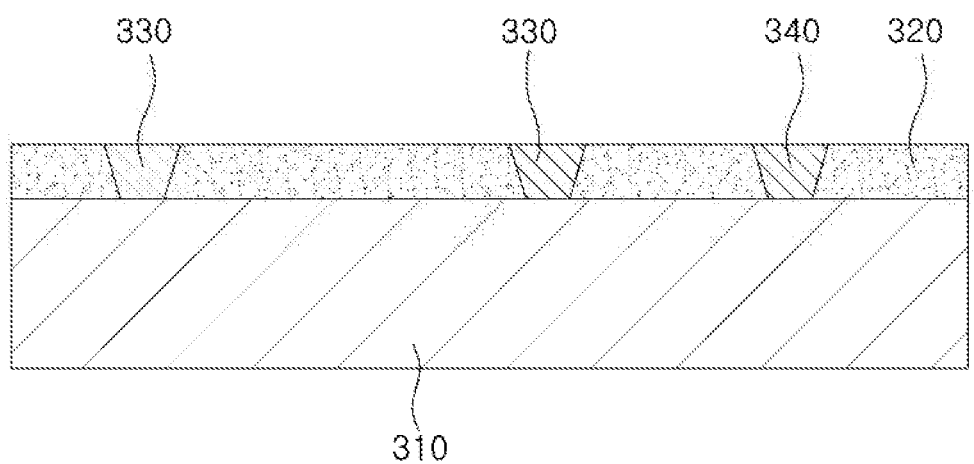

Subsequently, as illustrated in FIG. 4, the lower electrode connection member 330 and the lower end portion of the upper electrode connection member 340 are formed in the plurality of groove portions 322. The lower electrode connection member 330 and the upper electrode connection member 340 are formed of a conductive material such as copper (Cu) or tungsten (W), for example.

Then, a planarization operation is performed on the upper surface of the structure in FIG. 4 through a chemical mechanical polishing (CMP) process as needed. As an example, the planarization operation may also be performed by a metal chemical mechanical polishing (CMP) process.

Figure 5:
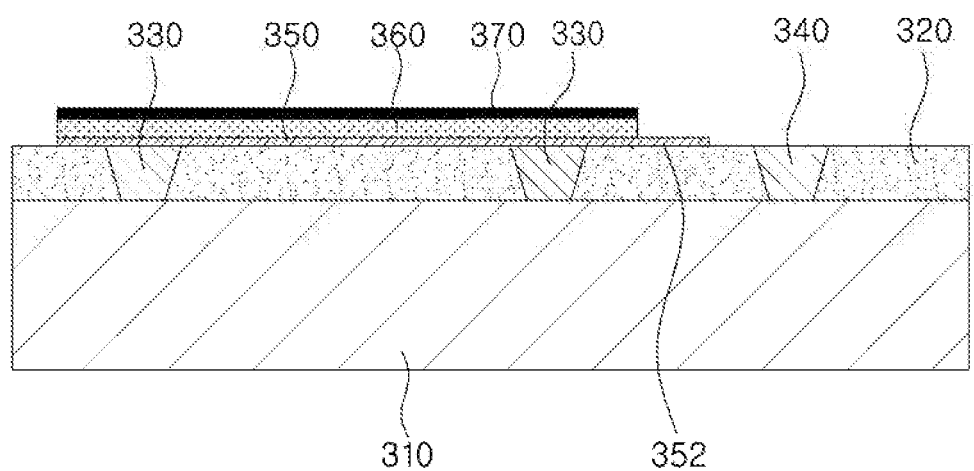

Then, as illustrated in FIG. 5, the lower electrode 350, the piezoelectric layer 360, and the upper electrode 370 are sequentially laminated. The lower electrode 350 is formed to have an extension portion 352, and the extension portion 352 is disposed so that it protrudes from the piezoelectric layer 360 and the upper electrode 370.

Figure 6:
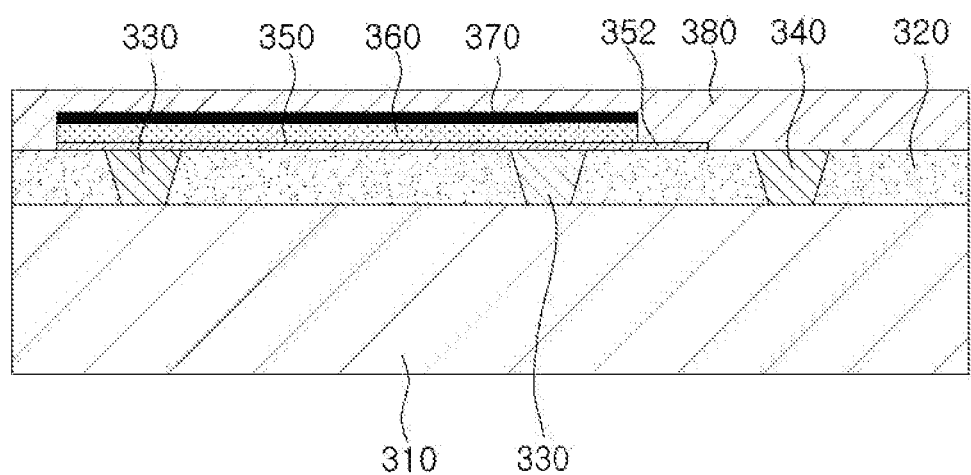

Next, as illustrated in FIG. 6, a dielectric layer 380 is formed on the sacrificial layer 320 so that the lower electrode 350, the piezoelectric layer 360, and the upper electrode 370 are embedded in the dielectric layer 380.

Figure 7:
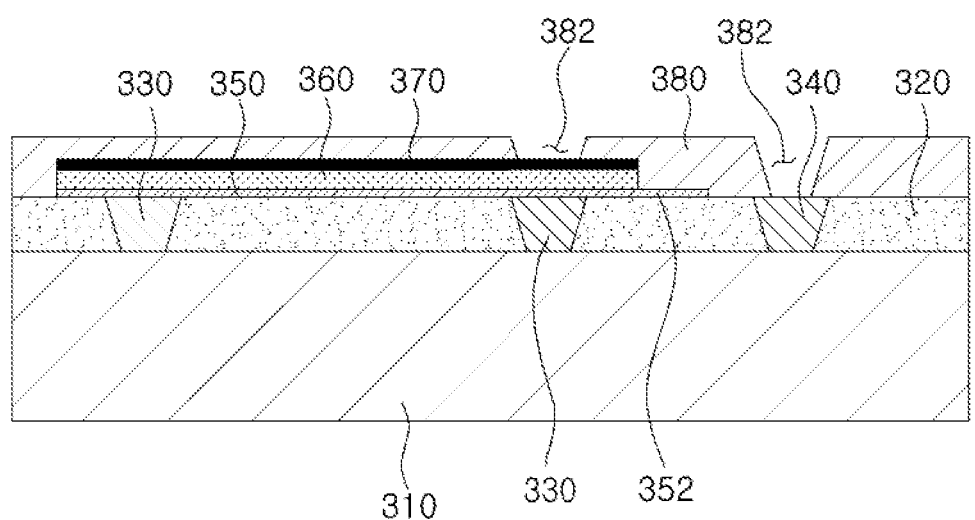

Subsequently, as illustrated in FIG. 7, formation holes 382 for formation of an upper portion of the upper electrode connection member 340 are formed in the dielectric layer 380.

Figure 8:
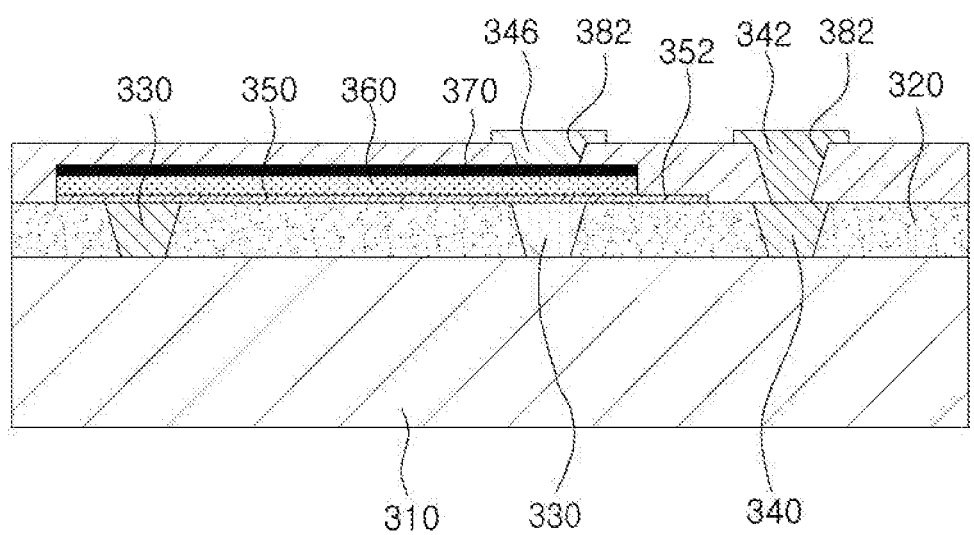

Thereafter, as illustrated in FIG. 8, the upper portion of the upper electrode connection member 340 is formed in the formation hole 382 of the dielectric layer 380. In the example in FIG. 8, a connection portion 346 of the upper electrode connection member 340 connected to the upper electrode 370 is formed in one of the formation holes 382, and an upper end portion of an anchor portion 342 of the upper electrode connection member 340 is formed in the other one of the formation holes 382.

Figure 9:
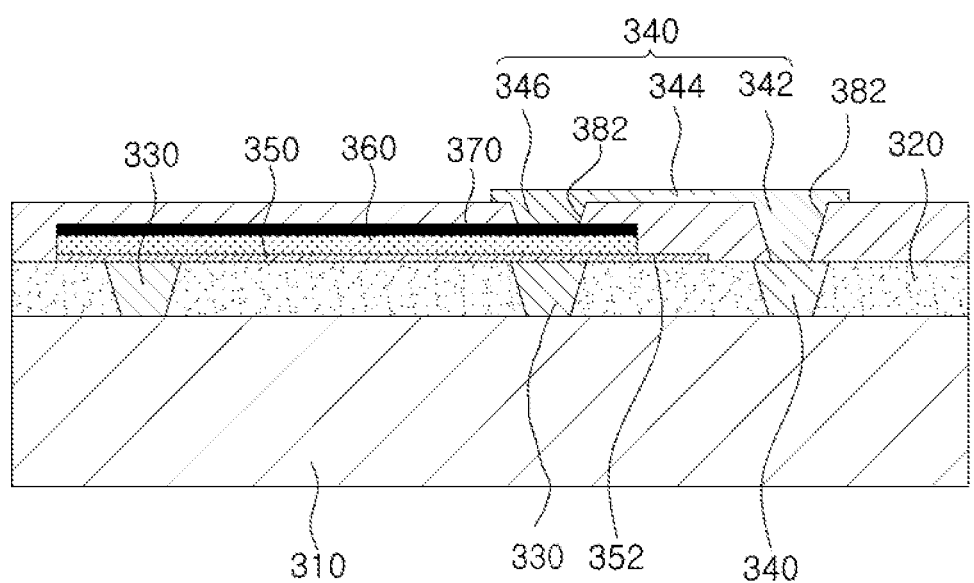

Then, as illustrated in FIG. 9, a plate portion 344 of the upper electrode connection member 340 is formed on an upper surface of the dielectric layer 380 to connect the connection portion 346 and the anchor portion 342 to each other.

Figure 10:
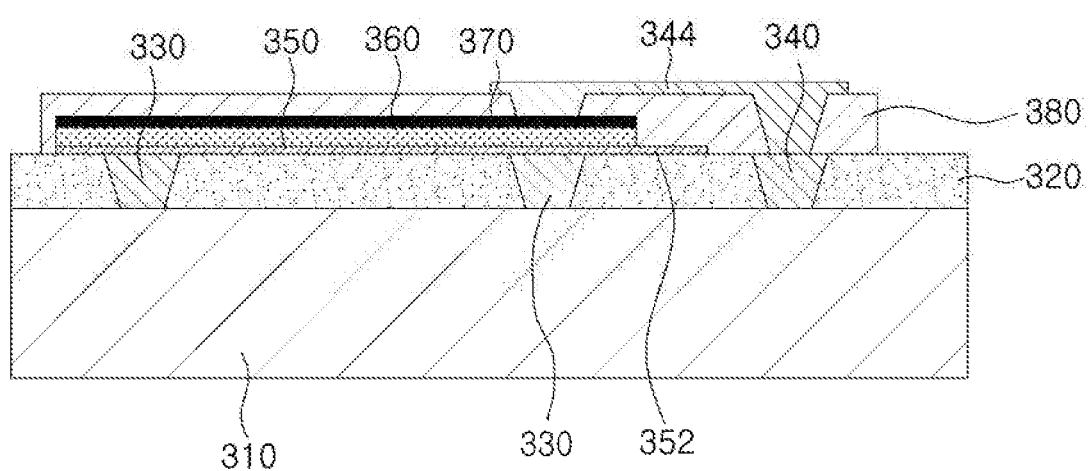

Next, as illustrated in FIG. 10, a portion of the dielectric layer 380 is removed by patterning.

Figure 11:
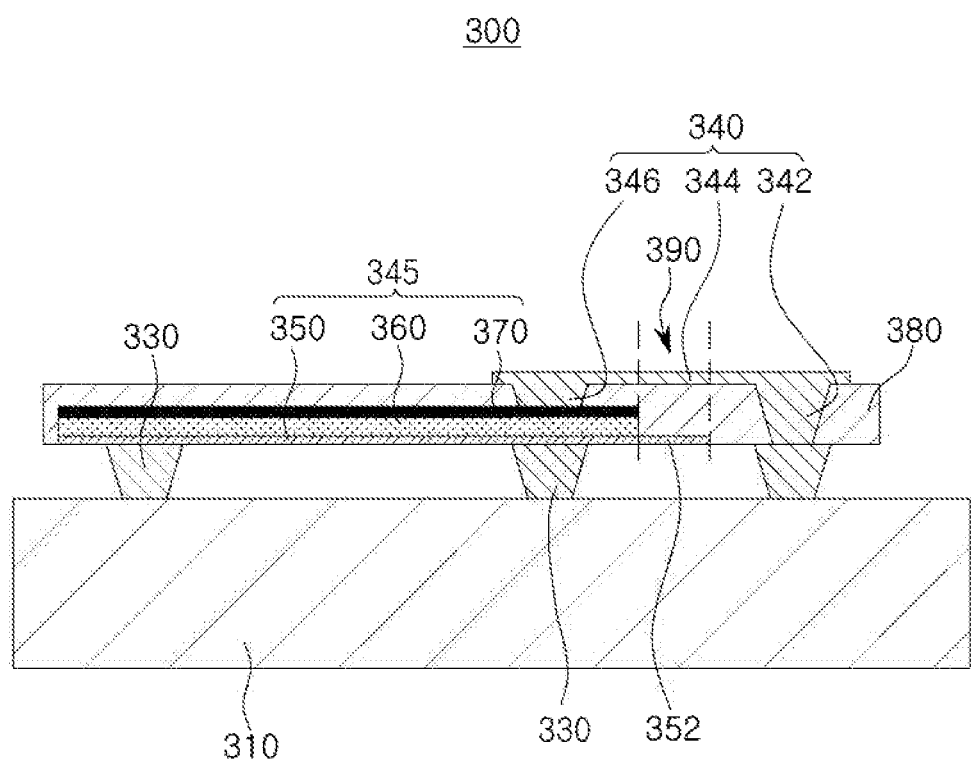

Then, as illustrated in FIG. 11, the sacrificial layer 320 formed on the substrate 310 is removed using a halide-based gas.

A capacitor portion 390 is constituted by the lower electrode 350, the dielectric layer 380, and the upper electrode connection member 340.

In detail, the capacitor portion 390 is constituted by the extension portion 352 extending from the lower electrode 350 to protrude outwardly from a remaining portion of the resonant portion 345, a portion of the upper electrode connection member 340 disposed above the extension portion 352, and a portion of the dielectric layer 380 disposed between the extension portion 352 and the portion of the upper electrode connection member 340.

In addition, a portion of the plate portion 344 of the upper electrode connection member 340 serves as an upper electrode of the capacitor portion 390.

The capacitor portion 390 is disposed outside of the lower electrode connection member 330, and is spaced apart from the substrate 310 by a predetermined distance.

Since the capacitor portion 390 is provided as described above, a frequency adjustment may be performed for the bulk acoustic wave resonator 300.

The examples set forth above enable a resonance frequency to be changed and matched through a frequency adjustment.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator comprising:
   a substrate;
   a lower electrode connection member disposed on the substrate;
   a lower electrode disposed on the lower electrode connection member;
   a piezoelectric layer disposed on the lower electrode;
   an upper electrode disposed on the piezoelectric layer;
   an upper electrode connection member electrically connecting the upper electrode to the substrate; and a dielectric layer in which the lower electrode, the piezoelectric layer, and the upper electrode are embedded;

wherein the dielectric layer is spaced apart from the substrate;

the lower electrode, the piezoelectric layer, and the upper electrode constitute a resonant portion;

the bulk acoustic wave resonator further comprises an extension portion extending from either the lower electrode or the upper electrode to protrude outwardly from the resonant portion; and a capacitor portion is constituted by the extension portion, a portion of the upper electrode connection member disposed above the extension portion, and a portion of the dielectric layer disposed between the extension portion and the portion of the upper electrode connection member disposed above the extension portion.

2. The bulk acoustic wave resonator of claim 1, wherein the capacitor portion is disposed outside of the lower electrode connection member.

3. The bulk acoustic wave resonator of claim 1, wherein the lower electrode connection member, the resonant portion, and the substrate form a cavity below the resonant portion; and the capacitor portion is spaced apart from the substrate.

4. The bulk acoustic wave resonator of claim 1, wherein the extension portion extends from the lower electrode.

5. The bulk acoustic wave resonator of claim 1, wherein the upper electrode connection member comprises:

an anchor portion disposed on the substrate;

a plate portion extending from the anchor portion parallel to an upper surface of the substrate; and a connection portion disposed on an upper surface of the upper electrode and connected to the plate portion.

6. The bulk acoustic wave resonator of claim 5, wherein a portion of the plate portion serves as an upper electrode of the capacitor portion.

7. The bulk acoustic wave resonator of claim 5, wherein an upper end portion of the anchor portion and the connection portion are embedded in the dielectric layer.

8. The bulk acoustic wave resonator of claim 1, wherein the lower electrode connection member electrically connects the lower electrode to the substrate and supports the resonant portion.

9. The bulk acoustic wave resonator of claim 8, wherein the lower electrode connection member has an annular shape and supports an edge portion of the resonant portion.

10. The bulk acoustic wave resonator of claim 1, wherein the substrate comprises a flat surface;

the lower electrode connection member is disposed on the flat surface of the substrate; and the upper electrode connection member electrically connects the upper electrode to the flat surface of the substrate on which the lower electrode connection member is disposed.

11. A bulk acoustic wave resonator comprising:

a substrate;

a lower electrode connection member disposed on the substrate;

a lower electrode disposed on the lower electrode connection member;

a piezoelectric layer disposed on the lower electrode;

an upper electrode disposed on the piezoelectric layer;

an upper electrode connection member electrically connecting the upper electrode to the substrate;

a dielectric layer in which the lower electrode, the piezoelectric layer, and the upper electrode are embedded;

wherein the dielectric layer is spaced apart from the substrate;

the lower electrode, the piezoelectric layer, and the upper electrode constitute a resonant portion;

the bulk acoustic wave resonator further comprises a first extension portion extending from either the lower electrode or the upper electrode to protrude outwardly from the resonant portion;

a first capacitor portion is constituted by the first extension portion, a portion of the upper electrode connection member disposed above the first extension portion, and a portion of the dielectric layer disposed between the first extension portion and the portion of the upper electrode connection disposed above the first extension portion;

the bulk acoustic wave resonator further comprises:

a second extension portion extending from either the lower electrode or the upper electrode to be spaced apart from the first extension portion and protrude outwardly from the resonant portion; and a second capacitor upper electrode disposed on the dielectric layer above the second extension portion; and a second capacitor portion is constituted by the second extension portion, the second capacitor upper electrode disposed above the second extension portion, and a portion of the dielectric layer disposed between the second extension portion and the second capacitor upper electrode.

12. The bulk acoustic wave resonator of claim 11, wherein the lower electrode connection member, the resonant portion, and the substrate form a cavity below the resonant portion; and the first and second capacitor portions are spaced apart from the substrate.

13. The bulk acoustic wave resonator of claim 11, wherein the first and second extension portions extend from the lower electrode.

14. The bulk acoustic wave resonator of claim 11, wherein the upper electrode connection member comprises:

an anchor portion disposed on the substrate;

a plate portion extending from the anchor portion parallel to an upper surface of the substrate; and a connection portion disposed on an upper surface of the upper electrode and connected to the plate portion.

15. The bulk acoustic wave resonator of claim 14, wherein a portion of the plate portion serves as an upper electrode of the first capacitor portion; and the second capacitor upper electrode serves as an upper electrode of the second capacitor portion.

16. The bulk acoustic wave resonator of claim 11, wherein the lower electrode connection member electrically connects the lower electrode to the substrate and supports the resonant portion.

17. The bulk acoustic wave resonator of claim 11, wherein the first and second capacitor portions are disposed outside of the lower electrode connection member.

18. The bulk acoustic wave resonator of claim 11, wherein the substrate comprises a flat surface;

the lower electrode connection member is disposed on the flat surface of the substrate; and the upper electrode connection member electrically connects the upper electrode to the flat surface of the substrate on which the lower electrode connection member is disposed.

19. A bulk acoustic wave resonator comprising:

a substrate;

a lower electrode connection member disposed on the substrate;

an upper electrode connection member disposed on the substrate;

a resonant portion disposed on the lower electrode connection member and comprising:
- a lower electrode disposed on the lower electrode connection member and electrically connected to the lower electrode connection member;
- a piezoelectric layer disposed on the lower electrode; and
- an upper electrode disposed on the piezoelectric layer and electrically connected to the upper electrode connection member; and a dielectric layer covering an upper surface of the resonant portion;

wherein the dielectric layer is spaced apart from the substrate;

either the lower electrode comprises an extension portion extending beyond an edge of the piezoelectric layer and an edge of the upper electrode toward the upper electrode connection member, or the upper electrode comprises an extension portion extending beyond an edge of the lower electrode member and an edge of the piezoelectric layer toward the upper electrode connection member;

the dielectric layer further fills a space between the extension portion and the upper electrode connection member; and a capacitor portion is constituted by the extension portion, a portion of the upper electrode connection member disposed above the extension portion, and a portion of the dielectric layer disposed between the extension portion and the portion of the upper electrode connection member disposed above the extension portion.

20. The bulk acoustic wave resonator of claim 19, wherein the upper electrode connection member comprises:
- a plate portion disposed on the dielectric layer;
- an anchor portion disposed on the substrate and connected to the plate portion through the dielectric layer; and
- a connection portion connected to the plate portion, and connected to the upper electrode through the dielectric layer.

21. The bulk acoustic wave resonator of claim 19, wherein the extension is a first extension and the capacitor portion is a first capacitor portion;
- either the lower electrode comprises a second extension portion extending beyond an edge of the piezoelectric layer and an edge of the upper electrode in a second direction different from a first direction in which the first extension extends toward the upper electrode connection member, or the upper electrode comprises a second extension portion extending beyond an edge of the lower electrode member and an edge of the piezoelectric layer in a second direction different from a first direction in which the first extension extends toward the upper electrode connection member;
- the bulk acoustic wave resonator further comprises a second capacitor upper electrode disposed on the dielectric layer above the second extension portion;
- the dielectric layer further fills a space between the second extension portion and the second capacitor upper electrode; and
- a second capacitor portion is constituted by the second extension portion, the second capacitor upper electrode, and a portion of the dielectric layer disposed between the second extension portion and the second capacitor upper electrode.

22. The bulk acoustic wave resonator of claim 19, wherein the lower electrode connection member is hollow and supports an edge portion of the resonant portion; and
- the lower electrode connection member, the resonant portion, and the substrate form a cavity under the resonant portion.

23. The bulk acoustic wave resonator of claim 19, wherein the substrate comprises a flat surface;
- the lower electrode connection member is disposed on the flat surface of the substrate; and
- the upper electrode connection member is disposed on the flat surface of the substrate on which the lower electrode connection member is disposed.

* * * * *